US010876533B2

(12) United States Patent
Luxford et al.

(10) Patent No.: US 10,876,533 B2
(45) Date of Patent: Dec. 29, 2020

(54) COOLING UNIT

(71) Applicant: Cooltera Limited, Horsham (GB)

(72) Inventors: Mark Steven Luxford, Gillingham (GB); David Shon Morgan, Tonbridge Wells (GB)

(73) Assignee: COOLTERA LIMITED, Horsham (GB)

( * ) Notice: Subject to any disclaimer, the term of this patent is extended or adjusted under 35 U.S.C. 154(b) by 65 days.

(21) Appl. No.: 16/104,215

(22) Filed: Aug. 17, 2018

(65) Prior Publication Data
US 2019/0055946 A1    Feb. 21, 2019

(30) Foreign Application Priority Data
Aug. 18, 2017 (GB) .................................... 1713297.8

(51) Int. Cl.
| F04D 13/02 | (2006.01) |
| B01D 29/31 | (2006.01) |
| B01D 35/26 | (2006.01) |
| F04D 29/22 | (2006.01) |
| F04D 29/58 | (2006.01) |

(Continued)

(52) U.S. Cl.
CPC ............ *F04D 13/024* (2013.01); *B01D 29/31* (2013.01); *B01D 29/33* (2013.01); *B01D 35/26* (2013.01); *F04D 13/0666* (2013.01); *F04D 29/048* (2013.01); *F04D 29/0473* (2013.01); *F04D 29/2266* (2013.01); *F04D 29/5866* (2013.01); *F04D 29/708* (2013.01); *G06F 1/20* (2013.01);

(Continued)

(58) Field of Classification Search
CPC .............. F04D 13/024; F04D 13/0666; F04D 13/0673; F04D 13/0693; F04D 29/0473; F04D 29/048; F04D 29/2266; F04D 29/5866; F04D 29/708; B01D 29/31; B01D 29/33; B01D 35/26; G06F 1/20; G06F 2200/201; H01L 23/473
See application file for complete search history.

(56) References Cited
U.S. PATENT DOCUMENTS
| 5,441,102 A | 8/1995 | Burward-Hoy |
| 6,171,078 B1 * | 1/2001 | Schob ................. F04D 13/0646 |
| | | 417/420 |

(Continued)

FOREIGN PATENT DOCUMENTS
| CN | 101122302 A | 2/2008 |
| GB | 2141040 A | 12/1984 |

OTHER PUBLICATIONS
Extended European Search Report for European Application No. 18188800.9, dated Jan. 15, 2019 (8 pages).

*Primary Examiner* — Igor Kershteyn
(74) *Attorney, Agent, or Firm* — Jason P. Gross; The Small Patent Law Group LLC

(57) ABSTRACT

A cooling unit comprising a coolant fluid pathway in which there is (a) a centrifugal pump which serves to pump coolant fluid along the pathway when the unit is in use, and (b) a heat exchanger which serves to cool the coolant fluid which is thus pumped along the pathway. The pump has a rotor constituted by a magnetically contactlessly driven impeller which is provided with at last one magnet and which is enclosed within a housing, and stator outside the housing and provided with at least one electromagnet operable to act on the said at least one magnet to rotate the impeller.

12 Claims, 7 Drawing Sheets

(51) Int. Cl.
*F04D 29/70* (2006.01)
*H01L 23/473* (2006.01)
*F04D 13/06* (2006.01)
*F04D 29/048* (2006.01)
*G06F 1/20* (2006.01)
*F04D 29/047* (2006.01)
*B01D 29/33* (2006.01)

(52) U.S. Cl.
CPC ...... *G06F 2200/201* (2013.01); *H01L 23/473* (2013.01)

(56) References Cited

U.S. PATENT DOCUMENTS

| | | | | |
|---|---|---|---|---|
| 6,227,797 B1* | 5/2001 | Watterson | ............... | F04D 13/00 415/107 |
| 6,227,817 B1* | 5/2001 | Paden | ................. | F04D 13/0646 417/356 |
| 8,579,607 B2* | 11/2013 | Wampler | ............ | F04D 13/0666 417/423.12 |
| 2001/0036061 A1* | 11/2001 | Donahoe | ................. | G06F 1/203 361/679.46 |
| 2004/0105232 A1 | 6/2004 | Ito et al. | | |
| 2004/0123614 A1 | 7/2004 | Stewart | | |
| 2005/0117298 A1 | 6/2005 | Koga et al. | | |
| 2005/0241809 A1 | 11/2005 | Tomioka et al. | | |
| 2006/0018775 A1 | 1/2006 | Oikawa | | |
| 2006/0247486 A1* | 11/2006 | Mendler | ............... | F04D 29/048 600/16 |
| 2007/0248456 A1* | 10/2007 | Mori | ...................... | B01D 35/26 415/169.1 |
| 2011/0195652 A1* | 8/2011 | Smith | ................ | H05K 7/20836 454/184 |
| 2012/0006509 A1 | 1/2012 | McCants | | |
| 2013/0022481 A1* | 1/2013 | Schob | ................... | F04D 29/048 417/420 |
| 2015/0233619 A1 | 8/2015 | Shedd | | |

* cited by examiner

COOLING UNIT

CROSS-REFERENCE TO RELATED APPLICATIONS

The present application claims the benefit of Patent Application No. GB1713297.8 from the United Kingdom, which was filed on Aug. 18, 2017 and is incorporated herein by reference in its entirety.

BACKGROUND

The subject matter relates to a combination of a cooling unit and a supercomputer connected to the cooling unit to be cooled thereby, the cooling unit comprising a centrifugal pump connected to a heat exchanger to pump coolant fluid therethrough and thereby to cool the coolant fluid.

The cooling unit is connected in a coolant fluid circuit which includes the heat sinks of the semiconductor chips. Thus coolant fluid flows from the output of the heat exchanger of the supercomputer cooling unit to the heat sinks, where the coolant fluid cools the heat sinks, and then along a return path back to the pump. The pump pumps the coolant fluid to the input of the heat exchanger, where the coolant fluid is cooled before it passes out from the heat exchanger at an output therefrom, and onwards to pass around the coolant fluid circuit continuously.

Hitherto in such a cooling unit, the pump has comprised an electric motor having a drive axle which passes through a bearing and a seal between the axle and an impeller housing, to an impeller of a centrifugal pump to which it is drivingly connected. In the event that the seal fails, coolant fluid may escape from the circuit with the possible result that the semiconductor chips overheat to such an extent that they may be damaged or even destroyed. Seal and/or bearing failure may occur through wear or through overheating as a result of cavitation in the coolant fluid, or a loss of coolant fluid from the circuit through leaks other than through the seal. Furthermore the particles from the bearing may break away therefrom and may be carried in the coolant fluid to the heat sinks. The latter typically have a fine ridging or microfins or microchannels on to or within which the coolant is entrained to create turbulence or at least a better heat exchange between the heat sink and the coolant fluid, and such particles may have a detrimental effect on such heat exchange.

SUMMARY

Embodiments seek to provide a remedy to what is set out in the prior paragraph.

Accordingly, at least one embodiment is directed to a combination of a cooling unit and a supercomputer connected to the cooling unit to be cooled thereby, the supercomputer having heat sinks of semiconductor chips in a coolant fluid circuit of the supercomputer, which heat sinks have fine ridging or microfins or microchannels, the cooling unit comprising a coolant fluid pathway in which there is (a) a centrifugal pump which serves to pump coolant fluid along the pathway when the unit is in use, and (b) a heat exchanger which serves to cool the coolant fluid which is thus pumped along the pathway, the cooling unit being connected in the said coolant fluid circuit of the supercomputer, in which the pump has a rotor constituted by a magnetically driven circular impeller which is provided with at last one magnet and which is enclosed within a housing having a circular interior within which fits the magnetically driven circular impeller, and a stator outside the housing and provided with at least one electromagnet operable to act on the said at least one magnet to rotate the impeller, characterized in that the housing is an inert plastics housing and the circular impeller is an inert plastics circular impeller within which the said at least one magnet is encapsulated whereby the impeller is magnetically contactlessly driven and is magnetically levitated so that it is not in contact with any of the walls of the housing and when it rotates it does so contactlessly.

Such a construction avoids any contact between a moving and a stationery part that may give rise to frictional wear and heating.

When the unit is connected for use, with coolant within the coolant pathway, the coolant fluid may comprise water, with or without an additive such as a bactericide or glycol.

This provides a fluid coolant with a high specific heat, highly effective for heat transference.

The presence of a bactericide reduces the risk of bacteria colonies forming for example on the fine ridge formations of heat sinks when the device is in use to cool such heat sinks.

The presence of glycol enables the unit to be used in low temperature climates.

The cooling unit of one more embodiments may further comprise a filter in the coolant fluid pathway to filter the coolant fluid.

Such a construction provides the further benefit of being able to remove detritus or particles resulting from wear or corrosion that may otherwise accumulate in the fluid coolant and cause a blockage or damage to the fine ridging of heat sinks when the unit is connected to cool such heat sinks.

The filter may comprise a mesh through which the coolant fluid flows when the unit is in use.

The filter may further comprise a cylindrical perforated wall surrounded by such a mesh.

The hole size of the mesh may be 20 to 100 microns in diameter, preferably 50 microns.

The filter may be attached to the pump.

This provides for a compact unit.

An efficient manner of manufacture may be obtained if the filter is so attached to the pump that the inlet to the pump is in fluid communication with the interior of such a cylinder of the filter.

Embodiments include a method of operating a supercomputer using a combination of a cooling unit and a supercomputer as described herein.

BRIEF DESCRIPTION OF THE DRAWINGS

An example of a cooling unit which in combination with a supercomputer to which it is connected when in use, constitutes one embodiment, and will now be described in greater detail with reference to the accompanying drawings, in which.

DETAILED DESCRIPTION OF EMBODIMENTS

Figure 1:
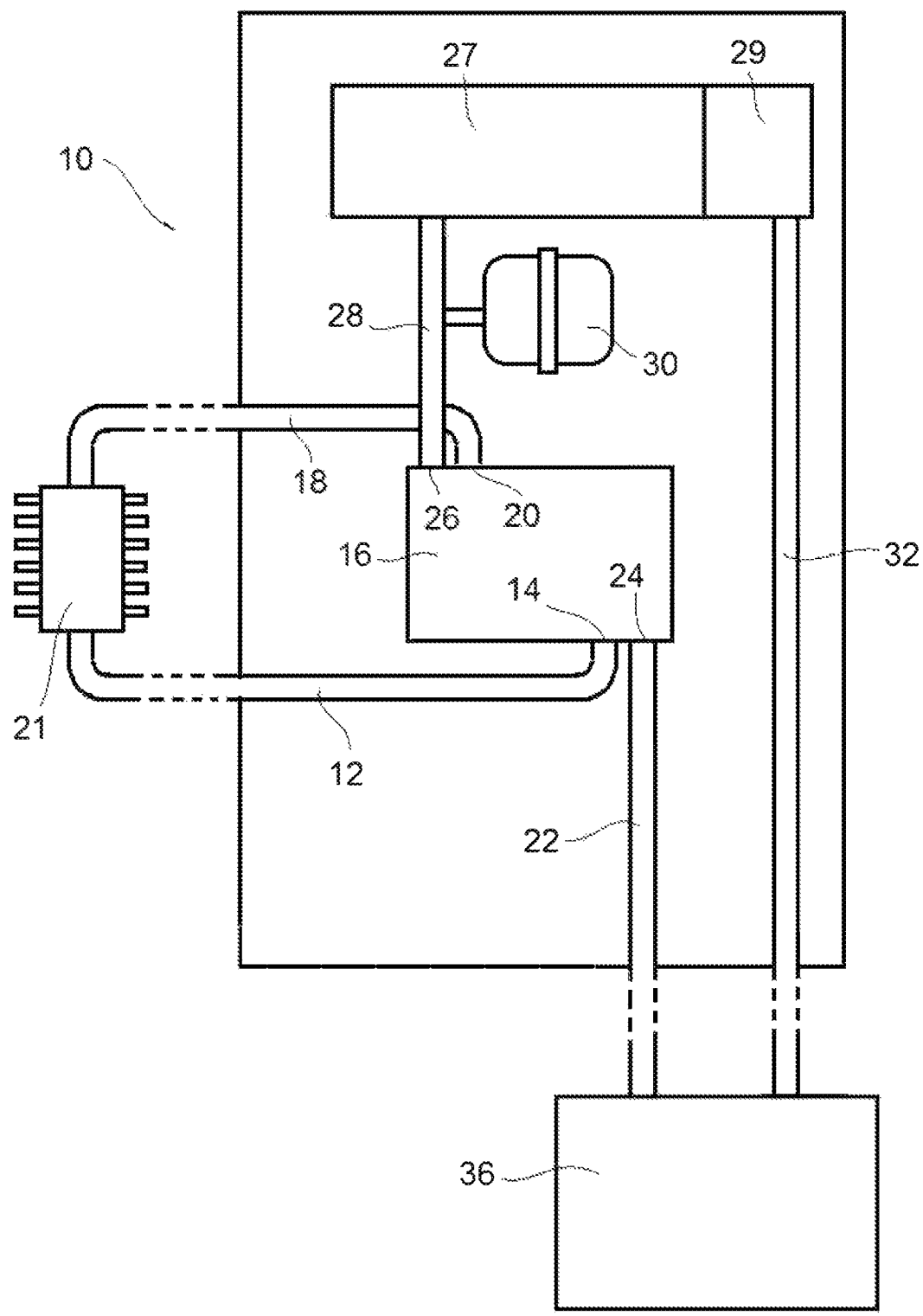
FIG. 1 is a diagrammatic plan view of such a cooling unit in accordance with an embodiment.

The cooling unit 10 shown in FIG. 1, for cooling heat sinks of semiconductor chips of a supercomputer, comprises a primary fluid coolant pathway constituted by an inlet pipe 12 connected to the primary pathway inlet 14 of a multi-plate heat exchanger 16, and a primary pathway outlet pipe 18 connected to a primary pathway outlet 20 of the heat exchanger 16. When the unit is in use, a radiator and pump 21 is connected in fluid communication with the inlet pipe 12 and the outlet pipe 18, to pass cooled water continuously through the heat exchanger 16.

The cooling unit 10 also comprises a secondary coolant pathway constituted by an inlet pipe 22 connected to a secondary pathway inlet 24 of the heat exchanger 16, the secondary pathway outlet 26 of which is connected to the inlet of a filter 27 via a connecting pipe 28. The outlet (not shown in FIG. 1) of the filter 27 is connected a pump 29 the outlet of which is connected to an outlet pipe 32 of the unit 10. The connecting pipe 28 is provided with an expansion vessel 30 to maintain a predetermined pressure of water in that pipe and hence in the filter 27 and in the inlet to the pump 29.

When the unit 10 is in use, a supercomputer 36 is connected to the inlet pipe 22 and the outlet pipe 32 of the unit 10, so that cooled water from the heat exchanger 16 is passed through the filter 27, and is pumped by the pump 29 through the outlet pipe 32 to the coolant distribution manifold (not shown) of the supercomputer 36 to conduct fluid to and cool the heat sinks (not shown) within the supercomputer. The water is then returned via a return manifold (not shown) to the inlet pipe 22 and thence back to the filter 27 via the heat exchanger 16 to begin the next cycle around the secondary coolant circuit. Thus cooling water is pumped continuously across the heat sinks of the supercomputer 36.

Figure 1A:
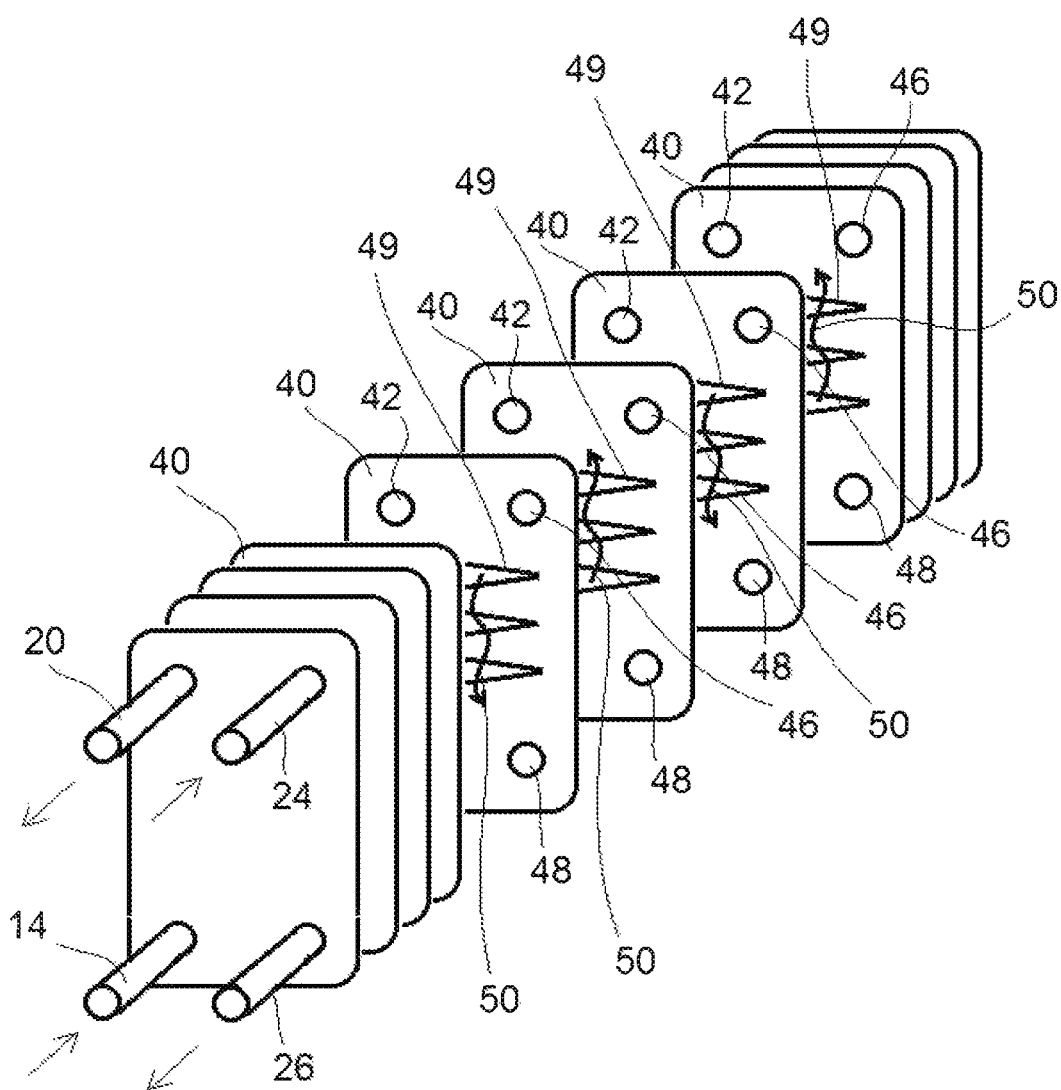
FIG. 1a is an exploded view of a part of the unit shown in FIG. 1.

Details of the heat exchanger 16 are shown in FIG. 1a. Dividing plates 40 define primary circuit and secondary circuit pathways of the exchanger 16, the plates 40 being spaced apart and the successive spaces between the plates 40 alternately constituting parts of the primary circuit pathway and the secondary circuit pathway. This is achieved by having the primary pathway inlet 14 and the primary pathway outlet 20 opening into the first space (the space between the two left-most plates 40 in FIG. 1a), and the secondary pathway inlet 24 and the secondary pathway outlet 26 bypassing the first space and opening out into the second space between the second and third plates 40. Respective rings (not shown) around and between the rims of upper left-hand corner apertures 42 of the second and third plates and around and between the rims of lower left-hand corner apertures (not visible in FIG. 1a) of the second and third plates 40 connect the first space to the third. Respective rings (not shown) around and between the rims of upper right-hand corner apertures 46 of the third and fourth plates 40 and around and between the rims of lower right-hand corner apertures 48 of the third and fourth plates 40 connect the second space to the fourth and so on throughout the heat exchanger 16. Zig-zag ridges 49 on the plates 40 cause the fluids within the pathways to meander in passing from the top to the bottom or from the bottom to the top of the heat exchanger 16, as indicated by the arrows 50. This improves the exchange of heat between the fluid in the secondary pathway and the fluid in the primary pathway when the unit 10 is in use.

Figure 2:
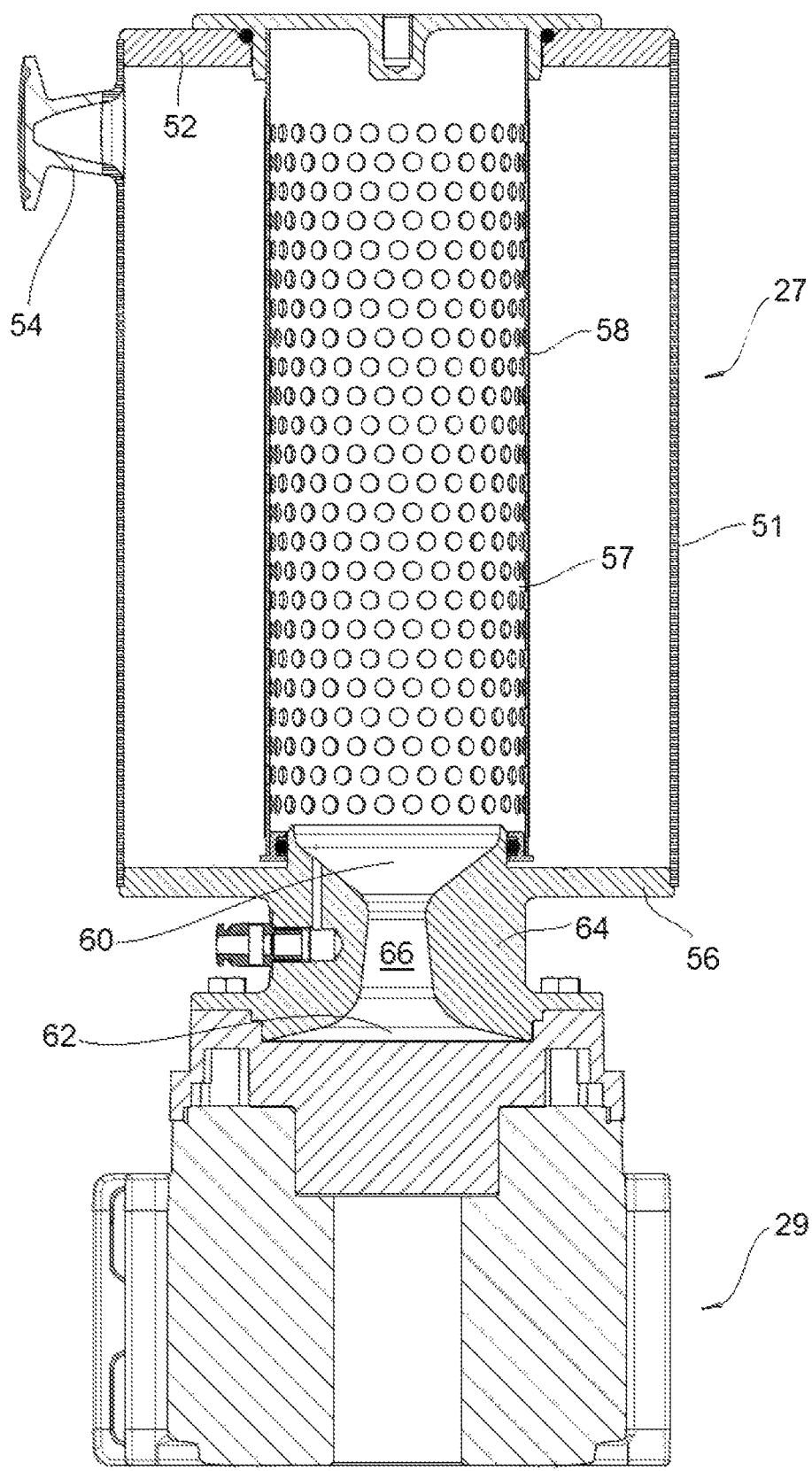
FIG. 2 is an axial sectional view of parts of the unit shown in FIG. 1.
Figure 3:
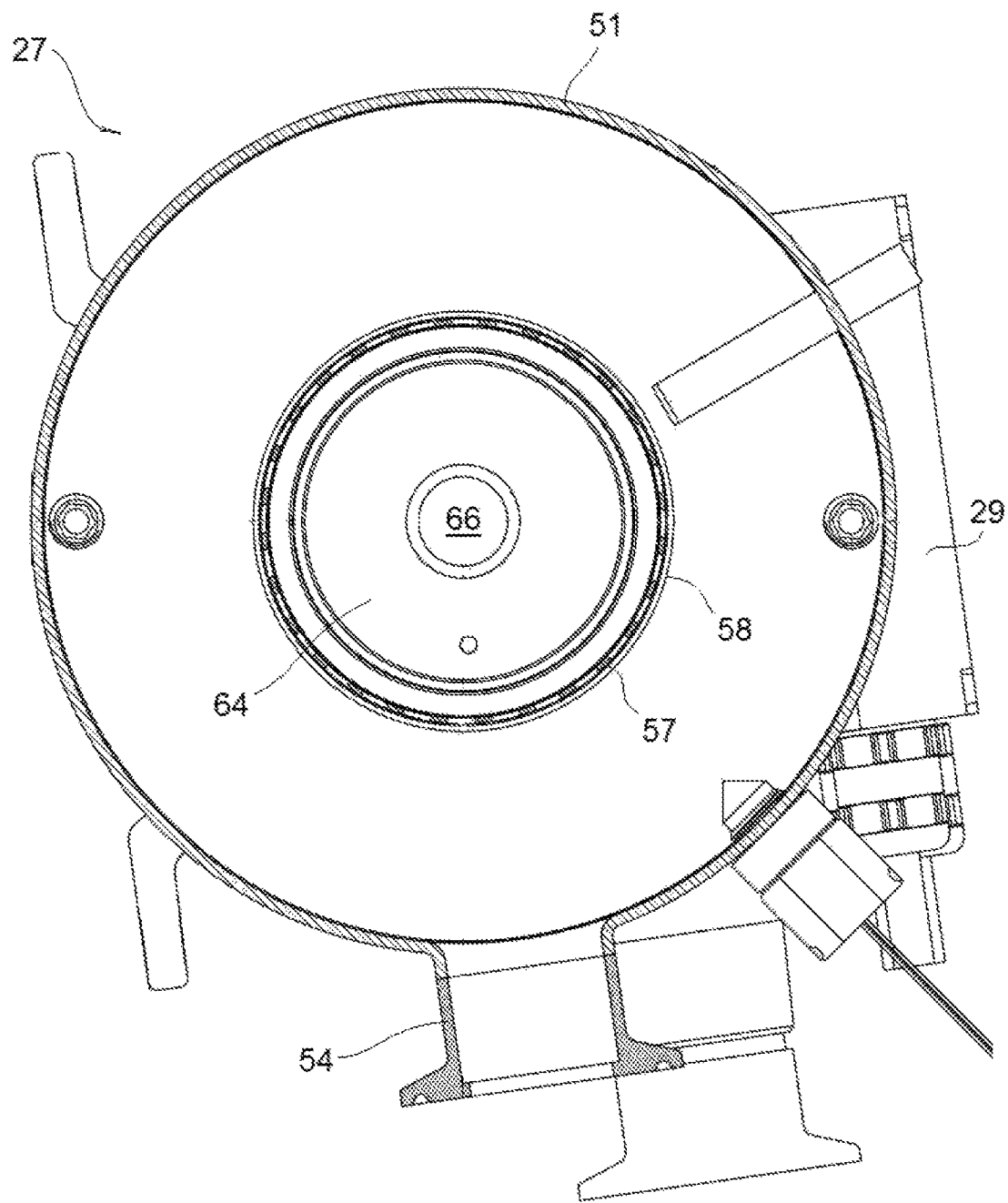
FIG. 3 is a cross-sectional view of the parts shown in FIG. 2.

Further details of the filter 27 are shown in FIGS. 2 and 3. Thus it comprises an outer cylindrical wall 51 closed by an upper circular wall 52 adjacent to which is provided the inlet 54 of the filter 27. One end (the lower end as viewed in FIG. 2) of the outer cylindrical wall 51 is closed by a bottom annular wall 56. A central inner cylindrical perforated wall 57 surrounded everywhere by a mesh 58 of hole size 50 microns extends from the bottom wall 56 to the upper wall 52, seals being provided between the mesh 58 and both walls 52 and 56.

The outlet 60 of the filter 27 and the inlet 62 of the pump 29 is provided by a single component 64, for example of stainless steel, which also provides the bottom wall 56 of the filter 27. Thus the component has an axially extending passageway 66 flared at an upper end to provide the outlet 60 of the filter 27 and at a lower end to provide the inlet 62 of the pump 29. The latter is represented in block form in FIG. 2.

Figure 4:
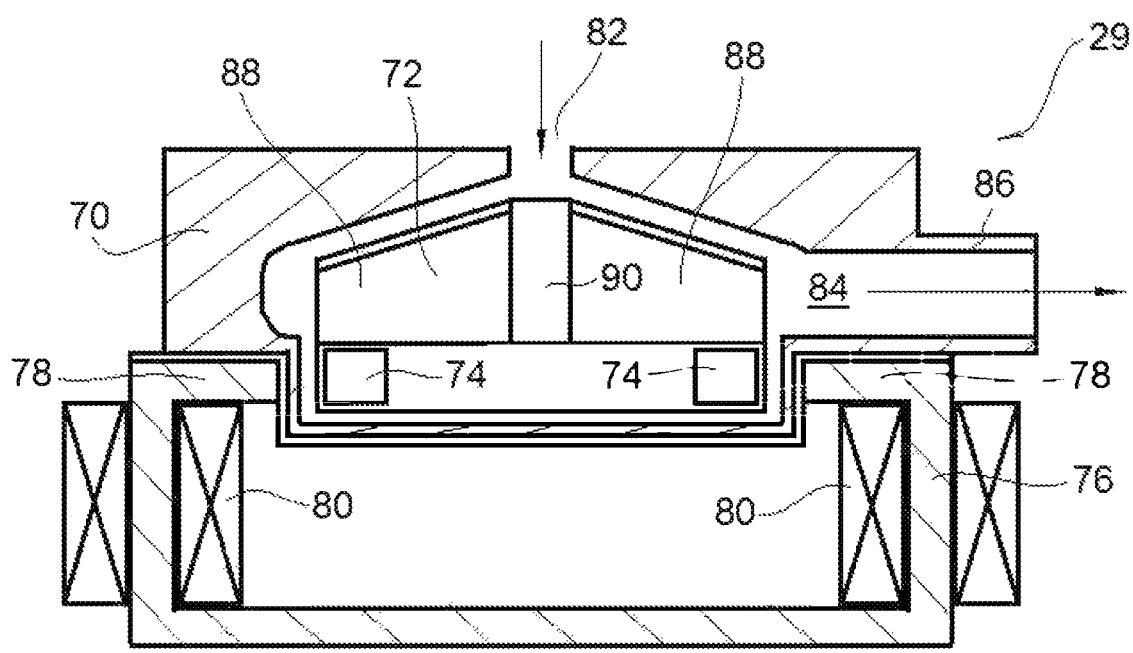
FIG. 4 is an axial sectional diagrammatic view of one of the parts shown in FIG. 2.
Figure 5:
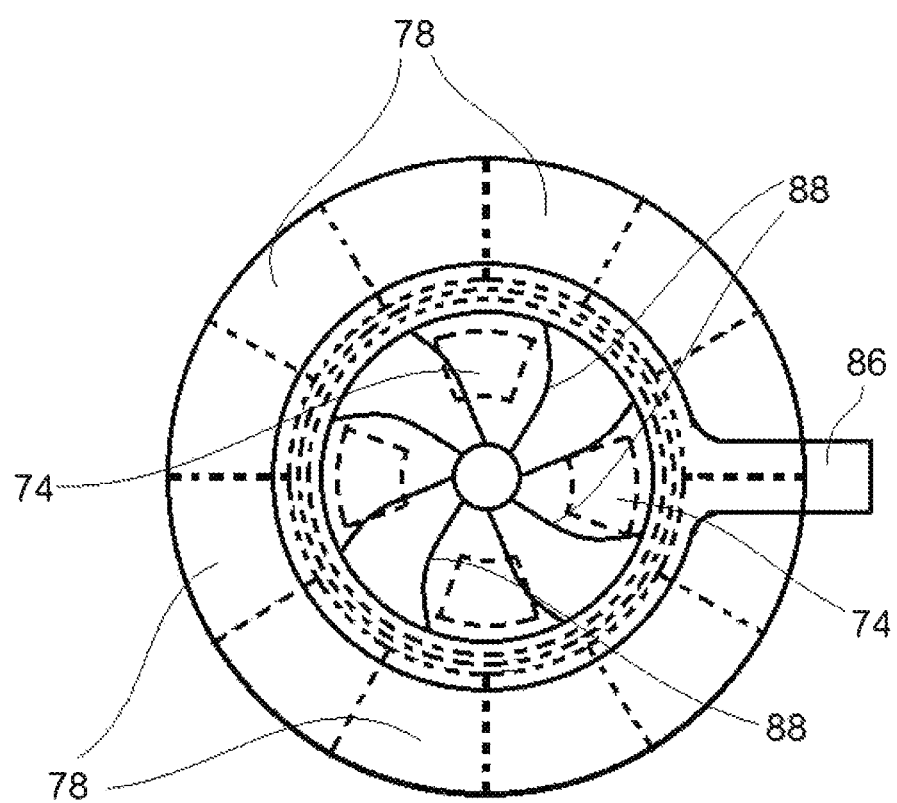
FIG. 5 is a cross-sectional diagram of the part shown in FIG. 4.

Details of the pump 29 are shown diagrammatically in FIGS. 4 and 5. Thus it has an inert plastics housing 70 having a generally circular interior within which fits an inert plastics circular impeller 72 within which are encapsulated four permanent magnets 74. These are equiangularly spaced around a lower perimeter of the impeller 72, and are so oriented that their outer poles from one magnet to the next alternate north with south.

A stator 76 surrounds a lower part of the housing 70 (part of which is provided by the component 64) which accommodates the lower part of the impeller 72 containing the magnets 74. The stator 76 is constituted by twelve magnetically permeable sections 78 respective portions of which are surrounded by respective electromagnetic coils 80.

The housing 70 has an upper aperture 82 at the inlet 62 of the pump 29, and a lateral aperture 84 at a transversely extending outlet 86 of the pump 29. Eight impeller blades 88 extend outwardly from an open centre 90 of the impeller 72, the blades being uniformly spaced around the impeller and spiraling radially outwardly.

When the unit is in use and an electrical current is passing through the electromagnetic coils 80, the impeller 72 is magnetically levitated, so that it is not in contact with any of the walls of the housing 70, and when it rotates it does so contactlessly.

Figure 6:
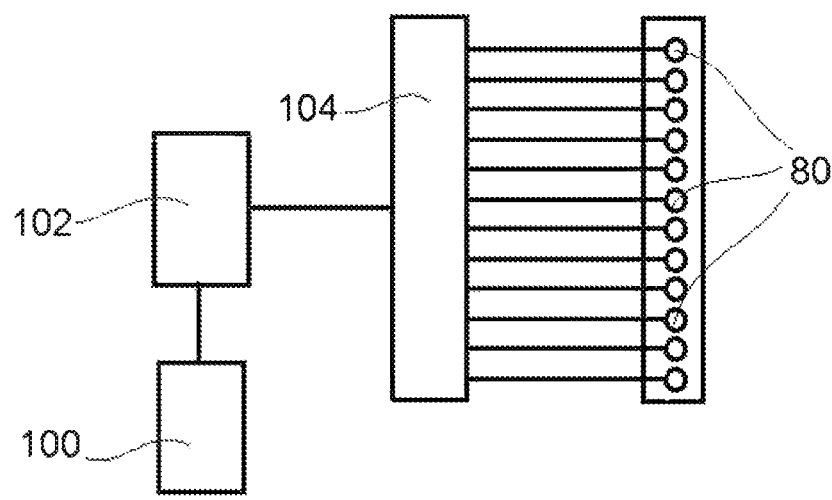
FIG. 6 shows a block circuit diagram of electronic drive circuitry of the parts shown in FIG. 4.
Figure 7:
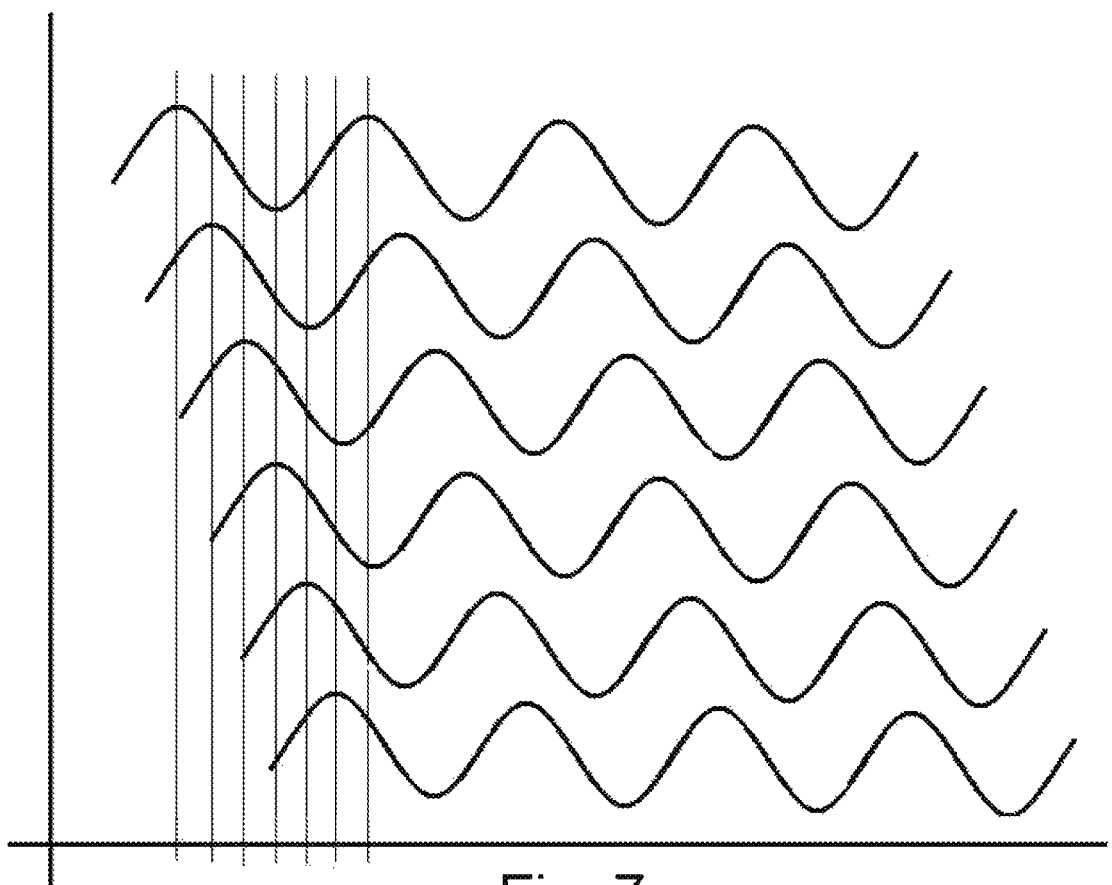
FIG. 7 is a set of explanatory graphs.

The electronic drive circuitry of the pump 29 is shown in FIG. 6. It comprises a controller 100 connected to control a sinusoidal oscillator 102. The latter is connected to the electromagnetic coils 80 via a phase splitter 104, so that each section 78 (shown in FIGS. 4 and 5) lags in phase with the next successive phase progressing around the stator 76 in a given direction by 60°, and the part of each section closest to the housing 70 alternates between being a south magnetic pole and a north magnetic pole according to the frequency of the sinusoidal oscillator, and out of phase with the next section proceeding around the stator in a given direction by 60°. The electrical current thus flowing through the respective coils 80 of successive sections 78 is shown in FIG. 7, which is a set of graphs one for each of six successive sections progressing around the stator 76. Each graph shows the sinusoidally varying strength of the electrical current flowing through the coil of a section as a function of time. Successively lower graphs show the current strength of successive sections respectively progressing around the stator 76, plotted on the same time scale. This variation of the current strength in the different coils 80 causes the impeller 72 to rotate at half the frequency of the oscillator 102. This in turn causes water in the impeller to be thrown outwardly and through the outlet 86 of the pump 29, so that the latter acts as a centrifugal pump.

Numerous modifications and variations may occur to the reader without the resulting construction falling outside the scope of the inventive subject matter. By way of example only, there are numerous electromagnetic drives which are possible for the pump 29, involving various numbers of impeller magnets and stator sections, although there must be at least one of each. The radiator and pump 21 may be replaced by a pump with a chiller, a fluid cooler, or a cooling tower for example.

It will be appreciated that in the embodiment of the pump illustrated in FIG. 4, magnetic levitation of the impeller 72 is achieved by having the magnetically permeable sections 78 located relative to the magnets 74 to lift the impeller 72 away from the housing 70 by magnetic forces acting between the magnetically permeable sections 78 and the magnets 74 when the pump is in use. This is irrespective of any dynamic forces acting on the impeller 72 by fluid within it or around it. This reduces the energy consumed by operation of the pump for a given output of coolant therefrom relative to a pump which uses dynamic fluid forces to lift the impeller.

What is claimed is:

1. A combination of a cooling unit and a supercomputer connected to the cooling unit to be cooled thereby, the supercomputer having heat sinks of semiconductor chips in a coolant fluid circuit of the supercomputer, which heat sinks have fine ridging or microfins or microchannels, the cooling unit comprising a coolant fluid pathway in which there is (a) a centrifugal pump which serves to pump coolant fluid along the pathway when the unit is in use, and (b) a heat exchanger which serves to cool the coolant fluid which is thus pumped along the pathway, the cooling unit being connected in the said coolant fluid circuit of the supercomputer, in which the pump has a rotor constituted by a magnetically driven circular impeller which is provided with at lest one magnet and which is enclosed within a housing having a circular interior within which fits the magnetically driven circular impeller, and a stator outside the housing and provided with at least one electromagnet operable to act on the said at least one magnet to rotate the impeller, wherein the housing is an inert plastics housing and the circular impeller is an inert plastics circular impeller within which the said at least one magnet is encapsulated whereby the impeller is magnetically contactlessly driven and is magnetically levitated so that it is not in contact with any of the walls of the housing and when it rotates it does so contactlessly.

2. The combination according to claim 1, wherein the unit is connected for use with coolant within the coolant pathway, the coolant fluid comprising water.

3. The combination according to claim 2, wherein the coolant comprises water with a bactericide.

4. The combination according to claim 2, wherein the coolant comprises water with glycol.

5. The combination according to claim 1, wherein the unit further comprises a filter in the coolant fluid pathway to filter the coolant fluid.

6. The combination according to claim 5, wherein the filter comprises a mesh through which the coolant fluid flows when the unit is in use.

7. The combination according to claim 6, wherein the filter further comprises a cylindrical perforated wall surrounded by the mesh.

8. The combination according to claim 6, wherein the hole size of the mesh is from 20 to 100 microns in diameter.

9. The combination according to claim 7, wherein the hole size of the mesh is substantially 50 microns.

10. The combination according to claim 5, wherein the filter is attached to the pump.

11. The combination according to claim 5, wherein the filter is so attached to the pump that the inlet to the pump is in fluid communication with the interior of such a cylinder of the filter.

12. A method of operating a supercomputer using the combination of the cooling unit and the supercomputer according to claim 1.

\* \* \* \* \*